(12) United States Patent
Kawahara et al.

(10) Patent No.: US 7,863,744 B2
(45) Date of Patent: Jan. 4, 2011

(54) SEMICONDUCTOR DEVICE AND METHOD FOR MANUFACTURING SAME

(75) Inventors: Naoyoshi Kawahara, Kawasaki (JP); Yumi Saitou, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 196 days.

(21) Appl. No.: 11/969,233

(22) Filed: Jan. 4, 2008

(65) Prior Publication Data

US 2008/0211097 A1   Sep. 4, 2008

(30) Foreign Application Priority Data

Jan. 12, 2007   (JP)   ............... 2007-004189

(51) Int. Cl.
    *H01L 23/48*   (2006.01)
(52) U.S. Cl. .............. 257/751; 257/E21.476; 257/E23.01; 257/767; 438/653; 438/687; 438/678; 438/643
(58) Field of Classification Search ........... 438/687, 438/652, 643, 678, 625, 653; 257/751, 752, 257/E23.161, E21.476, E23.01, 767
See application file for complete search history.

(56) References Cited

U.S. PATENT DOCUMENTS 7,566,975 B2 * 7/2009 Motoyama ............. 257/762

2001/0030366 A1 * 10/2001 Nakano et al. ............ 257/758
2009/0218697 A1 *  9/2009 Gotoh et al. ............ 257/765

FOREIGN PATENT DOCUMENTS

JP   2004-260106   9/2004

* cited by examiner

*Primary Examiner*—Jarrett J Stark
*Assistant Examiner*—Wilner Jean Baptiste
(74) *Attorney, Agent, or Firm*—Young & Thompson

(57) ABSTRACT

A semiconductor device includes an insulating interlayer formed above a silicon substrate and provided with a concave portion in a certain location, a barrier metal film covering an inner wall of the insulating interlayer, a lower layer copper interconnect provided so as to be in contact with the barrier metal film and buried in the interior of the concave portion, and a protective film provided so as to be in contact with the lower layer copper interconnect and also provided on substantially the entire top surface of the lower layer copper interconnect. An upper surface of the lower layer copper interconnect is provided so as to be retracted to be closer to the substrate than an upper surface of barrier metal film on the side wall of the concave portion. The protective film contains Co or Ni as constituent element, and Co concentration or Ni concentration in the protective film in vicinity of the side wall of the barrier metal film is higher than Co concentration or Ni concentration in the barrier metal film in the central region of the concave portion.

13 Claims, 10 Drawing Sheets

↓ SUBSTRATE

100

|⎯⎯⎯⎯⎯⎯| 50 nm initial

|⎯⎯⎯⎯⎯⎯| 50 nm

380°C·20h

SEMICONDUCTOR DEVICE AND METHOD FOR MANUFACTURING SAME

This application is based on Japanese patent application No. 2007-4,189, the content of which is incorporated hereinto by reference.

BACKGROUND

1. Technical Field

The present invention relates to a semiconductor device and a method for manufacturing thereof.

2. Related Art

Conventionally, a structure of a semiconductor device including copper interconnects is known, which also includes a cap film having a function for preventing diffusion of copper formed on a copper interconnect. Japanese Patent Laid-Open No. 2004-260,106 describes a technology for forming interconnect-protective films composed of Co—W—P alloy film on an interconnect by an electroless plating process. In addition, Japanese Patent Laid-Open No. 2004-260,106 also discloses that the substrate is thermally processed at a temperature of, for example, 120 to 450 degrees C. after a series of a plating process, a rinse process and a drying process are consecutively conducted, so that an improved barrier property of the protective film formed in an exposed surface of the interconnect and an improved adhesiveness thereof with the interconnect can be achieved.

SUMMARY

However, the present inventors have studied on the interconnect structure as described in Japanese Patent Laid-Open No. 2004-260,106, and have found that there is a need to be improved in the following aspects. In the devices described in Japanese Patent Laid-Open No. 2004-260,106, both of the upper end of a barrier metal film and an upper surface of an interconnect are provided to be coplanar with the upper surface of the insulating interlayer. When a cap metal film is formed on such interconnect, there is concern that portions of the cap metal film run out of regions for forming the interconnect and the barrier metal film and are formed on the insulating interlayer. This may lead to defective situations such as a leakage between interconnects, time dependent dielectric breakdown (TDDB) or the like, and thus there is a concern that the reliability is deteriorated.

In such circumstance, the present inventors eagerly investigated a technology for stably forming a cap metal film in a region for forming of a barrier metal film and the interior thereof. According to the results of the investigations, it is found that a recessed structure, in which an upper surface of a metal film composed of copper that constitutes an interconnect is partially retracted toward the interior side of the substrate from the upper end of the barrier metal film, is employed, so that an unwanted extension of the cap metal film into regions except the desired region can be suppressed.

However, when such recess structure is employed, voids are easily formed in the metal film composed of copper from the vicinity of the side wall of the barrier metal, and thus there is still a problem, in which there is still needs to improve the reliability of the product.

To solve the problem, a further investigation has been carried out for finding the reason of such problem, and have found that such recessed structure provides a difficulty in forming the cap metal film near the inner surface of the barrier metal film, which leads to a formation of voids between the barrier metal side wall and the cap metal film.

In order to prevent deterioration in reliability of the metal film composed of copper such as electro-migration (EM), stress induced void (SIV) and the like, it is necessary to ensure the entire surface of the metal film composed of copper to be coated with a cap metal film. For such purpose, it should be designed that the cap metal film covers the metal film composed of copper, even in the inner surface of the barrier metal film, on which the cap metal film is difficult to be formed.

The present inventors therefore have eagerly carried out further investigation based on the above-described scientific knowledge for sufficiently covering the entire upper surface of the metal film composed of copper with a material that composes the cap metal film even if the recessed structure is adopted, and have eventually achieved the present invention.

According to one aspect of the present invention, there is provided a method for manufacturing a semiconductor device, comprising: forming an insulating film over a substrate; selectively removing the insulating film to form a concave portion; forming a barrier metal film over the insulating film in which the concave portion is formed so as to cover an inner wall of the concave portion; forming a metal film composed of copper over the insulating film having the barrier metal film formed thereover so as to fill the concave portion; partially removing the metal film composed of copper and the barrier metal film disposed outside of the concave portion and then retracting an upper surface of the metal film composed of copper to be closer to the substrate than the upper surface of the barrier metal film disposed over the side wall of the concave portion; forming a cap metal film over the metal film composed of copper while leaving a spacing over the metal film composed of copper in vicinity of the side wall of the barrier metal film, after partially removing the metal film composed of copper and retracting the upper surface of the metal film composed of copper; and forming an electrically conducting film that covers substantially the entire surface of the metal film composed of copper by causing a migration of a constituent material that composes the cap metal film into the spacing to broaden the cap metal film.

In the method according to the present invention, the upper surface of a metal film composed of copper is retracted to be closer to the substrate than the upper end of the barrier metal film or in other words the upper surface of the barrier metal film over the vertical side wall of the concave portion, before the cap metal film is formed. This allows preventing the cap metal film from being formed to extend from the inside of the concave portion beyond the region for forming the barrier metal film considerably exceeding to the top of the insulating film during the formation of the cap metal film, thereby reducing a deterioration in the reliability of the semiconductor device.

Further, in the present invention, a spacing over the metal film composed of copper is remained in vicinity of the side wall of the barrier metal film and a migration of a constituent material that composes the cap metal film into the spacing to broaden the cap metal film is caused, when the cap metal film is formed, thereby forming an electrically conducting film that covers substantially the entire surface of the metal film composed of copper. This ensures covering substantially the entire surface of the top of the metal film composed of copper with the constituent material of the cap metal film, even if a spacing is created between the side wall of the barrier metal film and the cap metal film. Thus, a diffusion of copper contained in the metal film composed of copper from the spacing is suppressed, thereby suppressing deterioration in reliability of the metal film composed of copper such as electro-migration (EM), stress induced void (SIV) and the like.

According to the present invention, the semiconductor device obtained by employing the above-described method for manufacturing the semiconductor device is presented.

According to another aspect of the present invention, there is provided a semiconductor device, comprising: an insulating film formed above a substrate and provided with a concave portion in a predetermined location; a barrier metal film covering an inner wall of the concave portion; a metal film composed of copper provided so as to be in contact with the barrier metal film and buried in the interior of the concave portion; and an electrically conducting film provided so as to be in contact with the top of the metal film composed of copper and also provided over substantially the entire top surface of the metal film composed of copper, the electrically conducting film containing cobalt (Co) or nickel (Ni) as a constituent element, wherein an upper surface of the metal film composed of copper is provided so as to be closer to the substrate than the upper surface of the barrier metal film disposed over the side wall of the concave portion; and wherein Co concentration or Ni concentration in the electrically conducting film in vicinity of the side wall of the barrier metal film is higher than Co concentration or Ni concentration in the electrically conducting film in the central region of the concave portion.

In the semiconductor device of the present invention, the upper surface of the metal film composed of copper is retracted to be closer to the interior of the substrate than the upper end of the barrier metal film disposed over the side wall of the concave portion, and the electrically conducting film containing Co or Ni is provided over substantially the entire top surface of the metal film composed of copper. Thus, a diffusion of copper contained in the metal film composed of copper is effectively inhibited in the semiconductor device of the present invention, providing a configuration exhibiting better reliability.

Here, the condition "the electrically conducting film is provided over substantially the entire top surface of the metal film composed of copper" is equivalent to a condition, in which the electrically conducting film is provided over the metal film composed of copper so as to reduce a deterioration in reliability of the metal film composed of copper such as electro-migration (EM), stress induced void (SIV) and the like due to the exposure of the upper surface of the metal film composed of copper to a level that induces no problem on the practical use. Provided that the above-described aspects are employed, a configuration having a smaller non-contacting region between the inner surface of the barrier metal film and the electrically conducting films is also available, in addition to the configuration that the barrier metal film is in perfect contact with the electrically conducting film over the entire peripheral inner surface of the barrier metal film.

As described above, according to the present invention, an improved reliability of the semiconductor device can be achieved.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described in reference to the annexed figures. In all figures, an identical numeral is assigned to an element commonly appeared in the figures, and the detailed description thereof will not be repeated.

Figure 1:
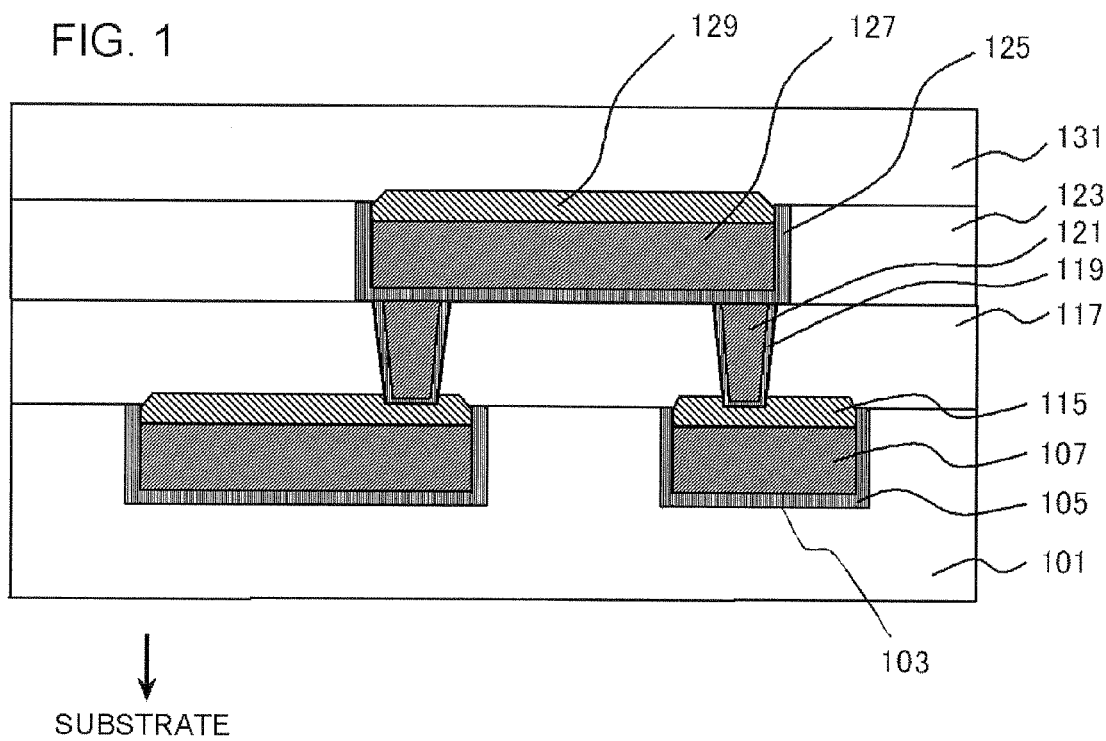
FIG. 1 is a cross-sectional view, illustrating a configuration of a semiconductor device in an embodiment.

FIG. 1 is a cross-sectional view, illustrating a configuration of a semiconductor device according to the present embodiment. A semiconductor device 100 shown in FIG. 1 includes an insulating film (insulating interlayer 101) formed above a substrate such as a semiconductor substrate, specifically a silicon substrate, and the like (not shown) and provided with a concave portion 103 in a certain location, a barrier metal film 105 covering an inner wall of the concave portion 103, a metal film composed of copper (lower layer copper interconnect 107) provided so as to be in contact with the barrier metal film 105 and buried in the interior of the concave portion 103, and an electrically conducting film (protective film 115) provided so as to be in contact with the upper portion of the lower layer copper interconnect 107 and also provided over substantially the entire top surface of the lower layer copper interconnect 107.

An upper surface of the lower layer copper interconnect 107 is provided so as to be retracted to be closer to the substrate than an upper end of the barrier metal film 105 such as tantalum nitride (TaN) film functioning as a diffusion barrier film for copper (Cu), or in other words than an upper surface of barrier metal film 105 that covers the side wall of the concave portion 103.

The electrically conducting film (protective film 115) is composed of a cap metal film and a migrated film that is provided by conducting a migration of a material into a portion of the cap metal film. The material for the cap metal film is the same as the material for the migrated film, and nickel (Ni) concentrations or cobalt (Co) concentrations in these films are different therebetween. In addition, the cap metal film and the migrated film are integrally formed to be a continuous body, and no junction is included.

More specifically, the protective film 115 contains Co or Ni as constituent element, and Co concentration or Ni concentration in the protective film 115 in vicinity of the side wall of the barrier metal film 105 is higher than Co concentration or Ni concentration in the barrier metal film 105 in the central region of the concave portion 103. In addition, the protective film 115 is in contact with the barrier metal film 105 in the entire circumference along the side wall of the barrier metal film 105. The thickness of the barrier metal film 105, for example, increases toward the interior of the concave portion 103 from the side wall of the barrier metal film 105.

In addition, in the semiconductor device 100, an insulating interlayer 117, an insulating interlayer 123 and an insulating interlayer 131 are stacked on the insulating interlayer 101 in this sequence. Each of the insulating interlayer 101, the insulating interlayer 117, the insulating interlayer 123 and the insulating interlayer 131 may be a single layer film or a multiple-layered film. Materials for these insulating interlayers may be, for example, a silicon dioxide ($SiO_2$) film. Further, the insulating interlayer may be a low dielectric constant insulating film such as a silicon oxycarbide (SiOC) film. A specific dielectric constant of the low dielectric constant insulating film may be, for example, equal to or lower than 3.5, and preferably equal to or lower than 3. Methods available for manufacturing of these films are not particularly limited to any specific process, and for example, chemical vapor deposition (CVD) process or a coating process may be employed.

A through hole is provided in the insulating interlayer 123, and a barrier metal film 125 such as a tantalum nitride (TaN) film and the like covers the inner wall of the through hole, and further, an upper layer interconnect 127 composed of a metal film composed of copper that is in contact with the barrier metal film 125 is buried in the through hole. A recessed structure, in which the upper surface of the upper layer interconnect 127 is retracted to be closer to the substrate than the barrier metal film 125, is also provided for the upper layer interconnect 127, similarly as the case of the lower layer copper interconnect 107. Further, a protective film 129 is provided to be in contact with the upper layer interconnect 127, and is also provided over substantially the entire top surface of the upper layer interconnect 127.

Further, a connecting plug composed of a barrier metal film 119 and a copper (Cu) film 121 is provided in the through hole provided in the insulating interlayer 117. The connecting plug is in contact with the protective film 115 in the bottom surface, and is also in contact with the barrier metal film 125 in the upper surface.

The protective film 115 and the protective film 129 contain, for example, one or more element selected from Co and Ni and one or more element selected from tungsten (W) and phosphorus (P) and boron (B) as constituent element, and more specifically, is composed of one or more electrically conducting films selected from a group consisting of cobalt tungsten phosphide (CoWP) film, cobalt tungsten boride (COWB) film, nickel tungsten phosphide (NiWP) film and nickel tungsten boride (NiWB) film. Materials for the protective film 115 and the protective film 129 may be the same, or may be different.

Exemplary implementations of the protective film 115 and the protective film 129, which are composed of Co, W and P, will be described as follows. In such case, atomic ratio of each constituent element in the protective film 115 and the protective film 129 in vicinity of the side wall of the barrier metal film may be, for example, 90 atomic % or more and 100 atomic % or less for Co, 0 atomic % or more and 3 atomic % or less for W, and 0 atomic % or more and 7 atomic % or less for P, over sum of Co, W and P contained in the protective film entire per a unit volume.

On the other hand, atomic ratio of each constituent element in the protective film in the central region of the concave portion may be, for example, 85 atomic % or more and 90 atomic % or less for Co, 2 atomic % or more and 5 atomic % or less for W, and 8 atomic % or more and 10 atomic % or less for P, over sum of Co, W and P contained in the protective film entire per a unit volume.

Next, a method for manufacturing the semiconductor device 100 will be described. The method for manufacturing the semiconductor device 100 includes, for example, the following process operations:

step 11: an insulating film (insulating interlayer 101) is formed on a substrate such as a semiconductor substrate (not shown);

step 12: the insulating interlayer 101 is selectively removed to form a concave portion 103;

step 13: a barrier metal film 105 that covers an inner wall of the concave portion 103 is formed on the insulating interlayer 101 having the concave portion 103 formed thereon;

step 14: a metal film composed of copper (Cu film 106 of FIG. 2B) is formed on the insulating interlayer 101 having the barrier metal film 105 formed thereon so as to plug the concave portion 103;

Step 15: portions of the Cu film 106 and the barrier metal film 105 formed outside of the concave portion 103 are removed and the upper surface of Cu film 106 is retracted to be closer to the substrate than the upper surface of the barrier metal film 105 on the side wall of the concave portion 103, so as to form the lower layer copper interconnect 107 composed of the Cu film 106;

step 16: after the operation of retracting the Cu film 106 (step 15), a cap metal film 111 is formed on the lower layer copper interconnect 107 while a spacing (gap 113) is remained on the lower layer copper interconnect 107 in vicinity of the side wall of the barrier metal film 105; and step 17: a migration of a constituent material of the cap metal film 111 into the gap 113 is caused to broaden the cap metal film 111, thereby forming an electrically conducting film (protective film 115) that covers substantially the entire top surface of the lower layer copper interconnect 107.

Further detailed description will be made as follows, in reference to FIG. 2A to FIG. 2D, FIG. 3A and FIG. 3B. FIG. 2A to FIG. 2D, FIG. 3A and FIG. 3B are cross-sectional views, illustrating a manufacturing process for the semiconductor device 100.

Figure 2A:
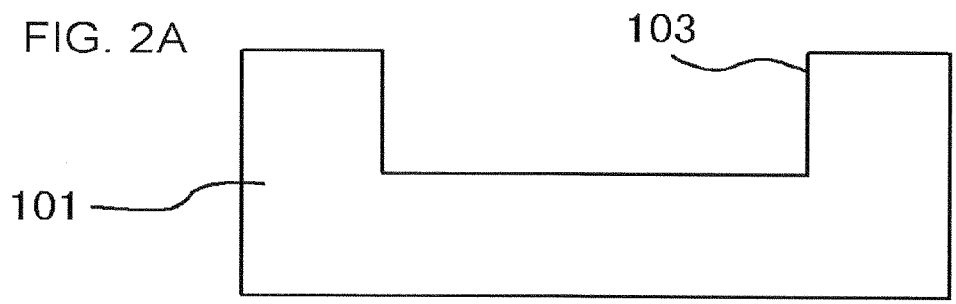
FIG. 2A to FIG. 2D are cross-sectional views, illustrating a manufacturing process for the semiconductor device shown in FIG. 1.

First of all, as shown in FIG. 2A, the insulating interlayer 101 is formed on the silicon substrate (not shown) having a predetermined device (not shown) such as transistor formed thereon. Then, portions of the insulating interlayer 101 in the region for forming the lower layer copper interconnect 107 is selectively etched off to form the concave portion 103.

Figure 2B:
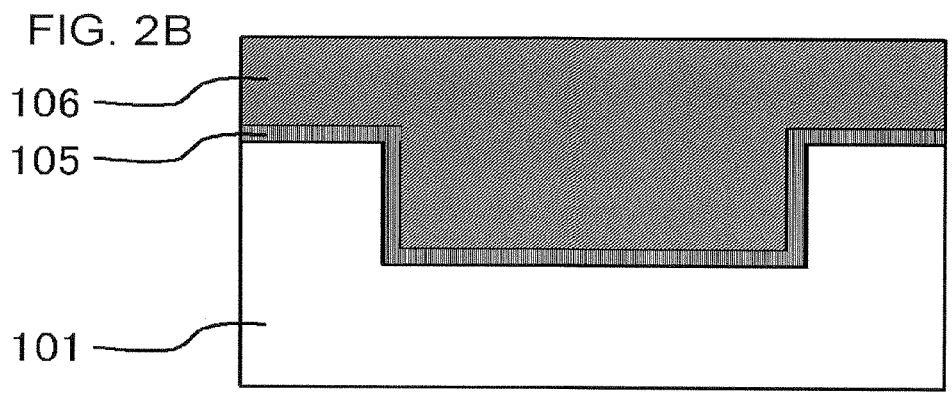
Figure 2C:
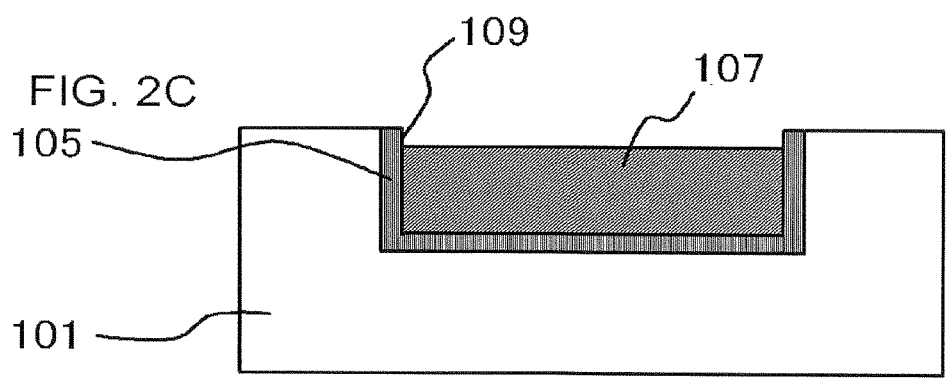

Next, as shown in FIG. 2B, the barrier metal film 105 is deposited on the insulating interlayer 101, and then the Cu film 106 is formed so as to plug the concave portion 103, and then, portions of the Cu film 106 and the barrier metal film 105 formed outside of the concave portion 103 as consecutively polished off by a chemical mechanical polishing (CMP) process to expose a surface of the insulating interlayer 101, thereby selectively forming a lower layer copper interconnect 107 composed of the Cu film 106 within the concave portion 103. At this time, the upper surface of the lower layer copper interconnect 107 is retracted to be closer to the substrate than the upper surface of the insulating interlayer 101 to form a stepper portion 109 (FIG. 2C). A height of the stepper portion 109 may be selected to be sufficiently larger to avoid a formation of the cap metal film 111 outside of the desired region, and may be for example about 70 to 80 nm.

Figure 2D:
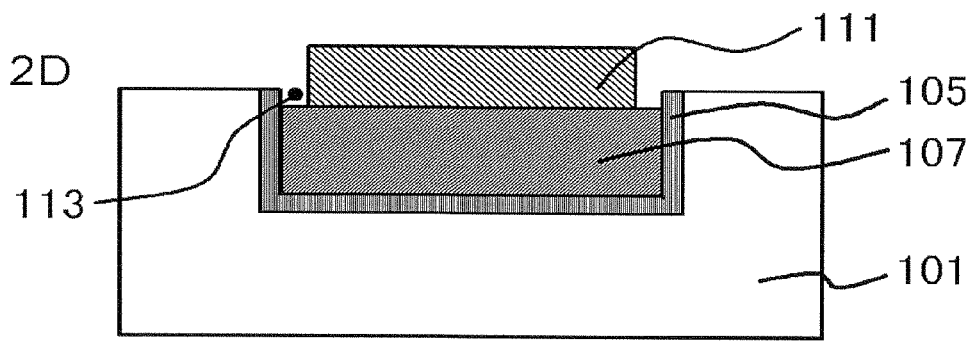

Subsequently, as shown in FIG. 2D, a gap 113 is formed between the side wall of the barrier metal film 105 and the cap metal film 111, while a COWP film is grown as the cap metal film 111 from the upper surface of the lower layer copper interconnect 107 by a selective plating process such as an electroless plating process and the like.

Figure 4A:
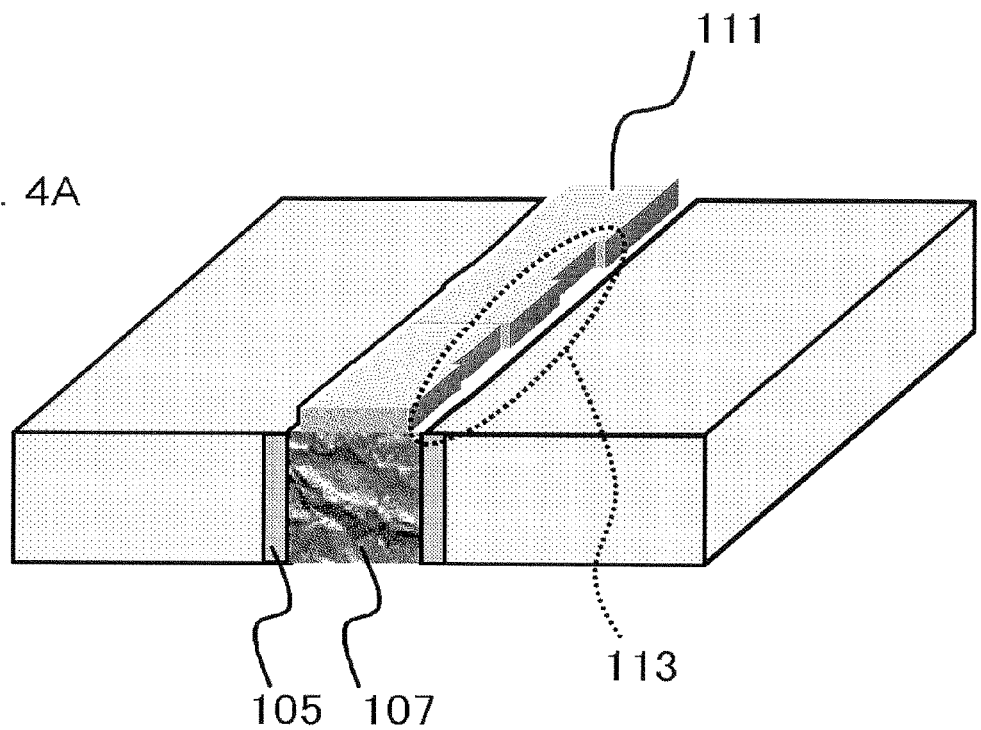
FIGS. 4A and 4B are perspective views, explaining a manufacturing process for the semiconductor device shown in FIG. 1.
Figure 5A:
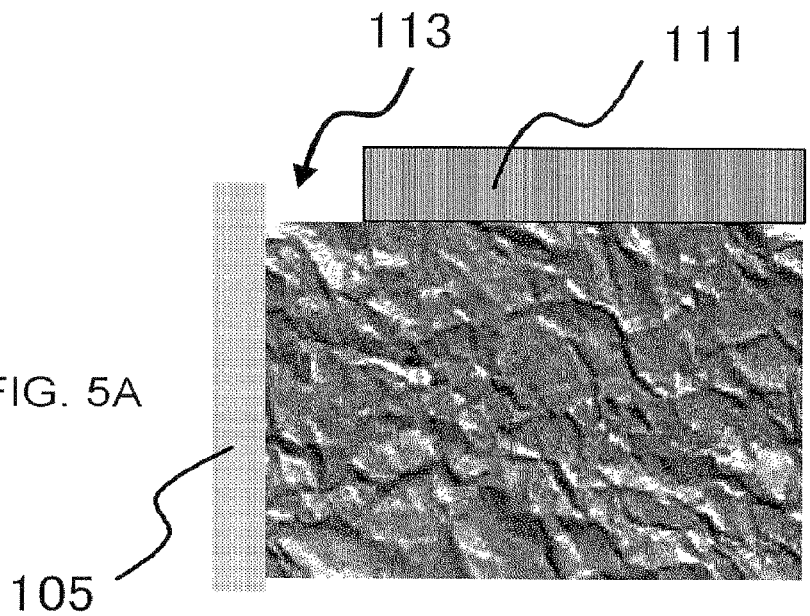
FIGS. 5A and 5B are cross-sectional views, explaining a manufacturing process for the semiconductor device shown in FIG. 1.

FIG. 4A and FIG. 5A are an enlarged perspective view and an enlarged cross-sectional view, respectively, of a portion of FIG. 2D. As shown in FIG. 4A, the gap 113 is formed along the side wall of the barrier metal film 105 in the present embodiment.

Figure 3A:
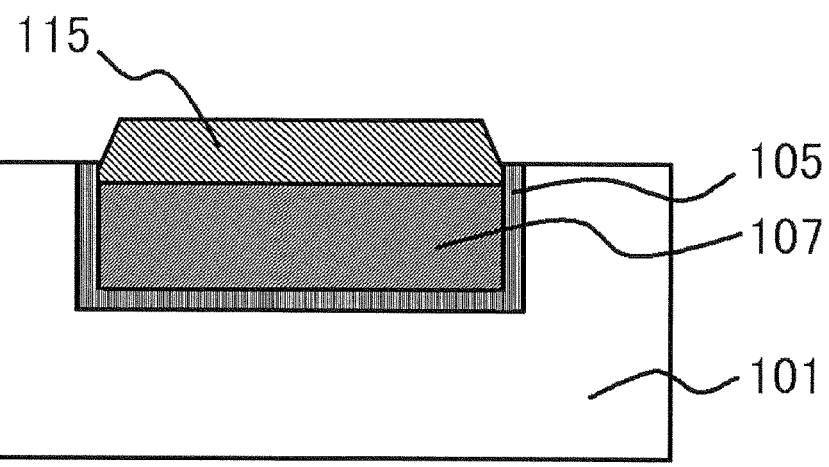
FIG. 3A and FIG. 3B are cross-sectional views, illustrating a manufacturing process for the semiconductor device shown in FIG. 1.

Then, as shown in FIG. 3A, the silicon substrate (not shown) having the cap metal film 111 formed thereon is heat-treated at a specified process condition, so that a migration of the constituent material of the cap metal film 111 into the gap 113 is carried out to broaden the cap metal film 111 to the entire upper surface of the lower layer copper interconnect 107, thereby forming the protective film 115. The thickness of the protective film 115 in the center of the concave portion 103 is, for example, about 120 nm.

Process conditions for the heat treatment for extending the cap metal film 111 so as to fill the gap 113 is selected according to the material of the cap metal film 111. For example, when the cap metal film 111 contains Co, W and P as constituent elements, the silicon substrate is heat-treated at a temperature 350 degrees C. or higher and 400 degrees C. or lower, for 5 hours or longer. The conditions for the heat treatment process in the present embodiment may be more specifically at a temperature of 380 degrees C., for 10 hours or longer and 24 hours or shorter, and more preferably at a temperature of 380 degrees C., for 15 hours or longer and 20 hours or shorter.

In addition to above, the heat treatment process temperature of equal to or higher than 350 degrees C., and preferably equal to or higher than 360 degrees C. allows further ensured migration of the constituent material of the cap metal film 111. Further, the heat treatment process temperature of equal to or lower than 400 degrees C., and preferably equal to or lower than 390 degrees C. may be preferably applied over the whole manufacturing process for the semiconductor device 100, even if a lower temperature process of equal to or lower than 400 degrees C., for example, is adopted.

Further, concerning the process time of the heat treatment process, shorter process time may cause insufficient filling of the gap 113, leading to a concern of a generation of a void in the lower layer copper interconnect 107. On the contrary, longer processing time reduces the manufacture efficiency of the semiconductor device 100.

In addition to above, as will be discussed later in the descriptions of examples, the protective film 115 of the present embodiment is not formed in the heat treatment process conducted in ordinary processes for manufacturing multiple-layered interconnect structures.

Figure 4B:
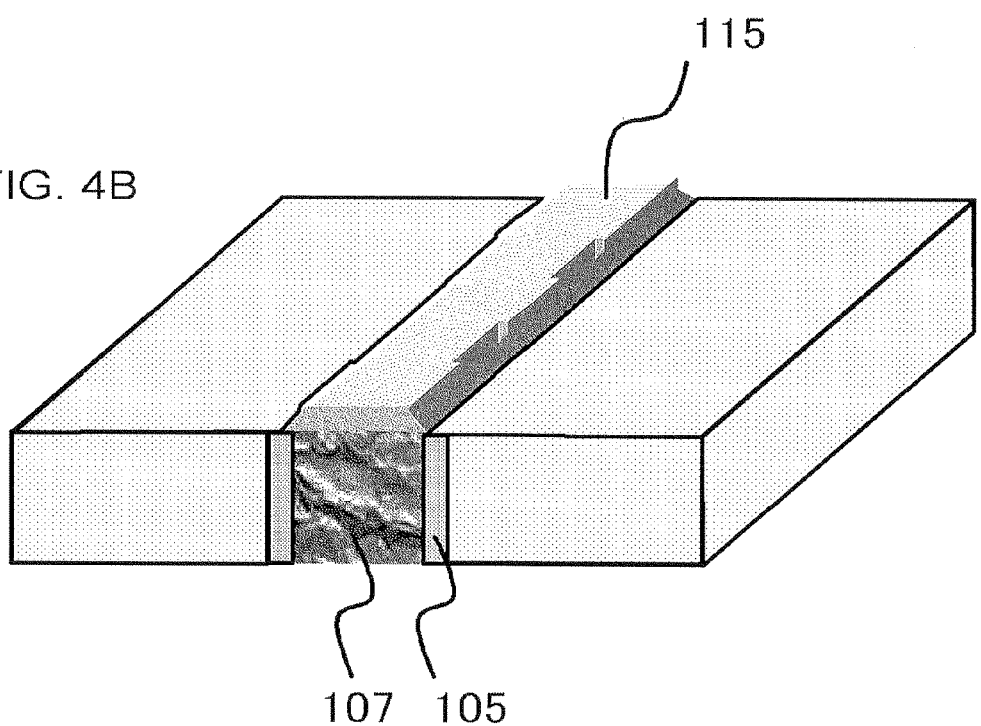
Figure 5B:
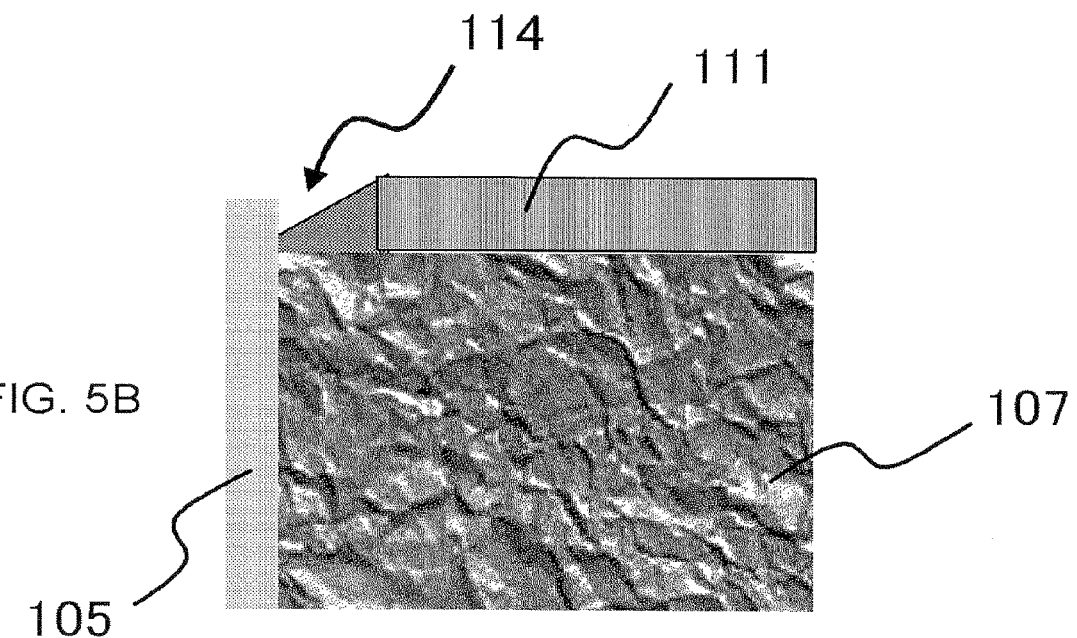

FIG. 4B and FIG. 5B are an enlarged perspective view and an enlarged cross-sectional view, respectively, of a portion of FIG. 3A. In the present embodiment, a migration of Co in the CoWP film serving as the cap metal film 111 into the gap 113 is preferentially achieved to form a region 114 containing Co at higher concentration that plugs the gap 113. Thus, the concentration of Co in the protective film 115 in vicinity of the side wall of the barrier metal film 105 is higher than the concentration of Co in the protective film 115 in the central region of the concave portion 103.

In addition to above, some of Co in the cap metal film 111 may be diffused to an interface between the side wall of the barrier metal film 105 and the lower layer copper interconnect 107 in the process for forming the protective film 115.

Figure 3B:
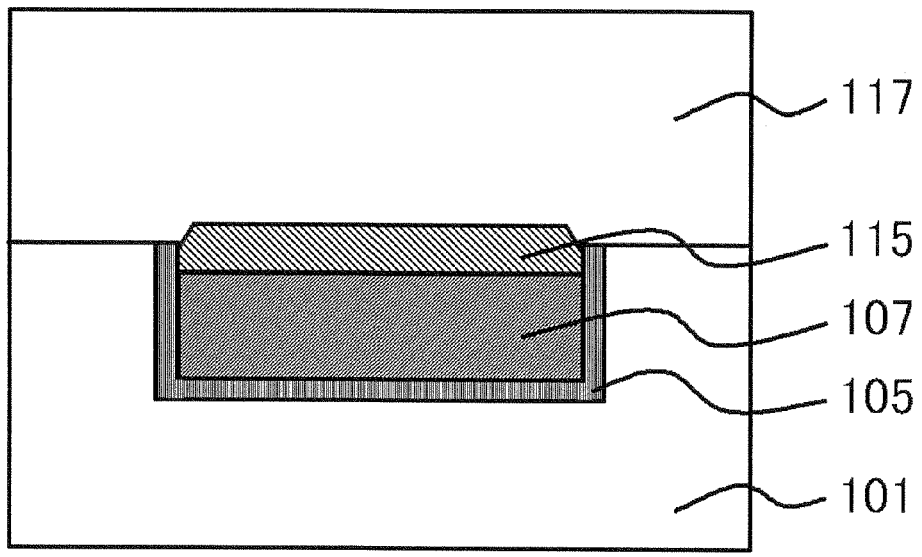

After the protective film 115 is formed in such way, as shown in FIG. 3B, the insulating interlayer 117 is formed on the insulating interlayer 101. Then, a connecting plug composed of the barrier metal film 119 and the Cu film 121 is formed in the insulating interlayer 117.

Then, the insulating interlayer 123 is formed on the insulating interlayer 117, the barrier metal film 125, the upper layer interconnect 127 and the protective film 129 are formed in a process pursuant to the above-described procedure in reference to FIG. 2A to FIG. 3B to form the insulating interlayer 131 on the insulating interlayer 117. The semiconductor device 100 shown in FIG. 1 is obtained by the above-mentioned procedure.

While the present embodiment involves forming the protective film 115 and the protective film 129 in the separate processes, the protective film 115 and protective film 129 may alternatively be formed in one process.

At this time, after the process shown in FIG. 2D, the insulating interlayer 117 is formed on the insulating interlayer 101 without forming the protective film 115, and then the series of processes until the process for forming the cap metal film on the upper layer interconnect 127 are carried out. Thereafter, the silicon substrate is heat-treated under the above-described conditions to cause a migration of the cap metal film 111 into the gap 113 and to cause a migration of the cap metal film on the upper layer interconnect 127 into a gap between the barrier metal film 125 and such cap metal film so that these cap metal films are broaden to form the protective film 115 and the protective film 129.

Since the protective films for a plurality of interconnect layers can be formed in one common process by the above-described procedure, further simplification of the manufacturing process can be achieved if the protective films are to be formed for respective interconnect layers.

Next, advantageous effects of the present embodiment will be described. The recessed structure, in which the upper surface of the lower layer copper interconnect 107 is retracted to be closer to the upper end of the barrier metal film 105 that covers the side wall of the concave portion 103, namely the upper end of the insulating interlayer in the present embodiment, is adopted, so that the cap metal film 111 can be stably formed in the inside of the region for forming the barrier metal film 105. Thus, this allows preventing the cap metal film 111 from being formed to extend from the top of the concave portion 103 beyond the region for forming the barrier metal film 105 considerably exceeding to the top of the insulating film 101, or from being considerably swelled to form a mushroom-shape. Thus, a leakage between the interconnects or a TDDB defect due to a defect in the formation of the cap metal film 111 is inhibited, and therefore the reliability of the semiconductor device 100 can be improved.

Further, since the cap metal film 111 is formed on the lower layer copper interconnect 107 having the stepped portion 109 formed therein by a selective plating process in the present embodiment, the cap metal film 111 is not formed in vicinity of the side wall of the barrier metal film 105, whereby remaining the gap 113. To solve the problem, after the cap metal film 111 is formed, the constituent material of the cap metal film 111 is migrated to the gap 113 to broaden the cap metal film 111, so that the protective film 115 is formed on the entire upper surface of the lower layer copper interconnect 107. Having this configuration, the upper surface of the lower layer copper interconnect 107 is ensured to be covered with the protective film 115 even if the formation of the cap metal film 111 creates the gap 113 remained therein, so that a generation of an electro migration (EM) of copper or a generation of a stress induced void (SIV) in vicinity of the gap 113 can be reduced. Thus, according to the present embodiment, an improved reliability of the semiconductor device 100 can be achieved. Such advantageous effect is considerably exhibited by employing the configuration, in which the protective film 115 is in contact with the side wall of the barrier metal film 105 in the entire circumference along the side wall of the barrier metal film 105.

The present invention has been described on the basis of the embodiment. A person having ordinary skills in the art will recognize that the embodiment described above is presented for an explanatory purpose only and that many alternative embodiments may also be applicable, which fall within the scope and spirit of the invention.

For example, while the exemplary implementation of forming the protective film 115 by heat-treating the cap metal film 111 under specified conditions is illustrated in the above-mentioned embodiment, the process for forming the protective film 115 is not limited thereto, and any other suitable processes may also be employed, provided that the process involves a migration of the constituent material of the cap metal film 111 to the gap 113 to broaden the cap metal film 111.

EXAMPLES

Example

Figure 6A:
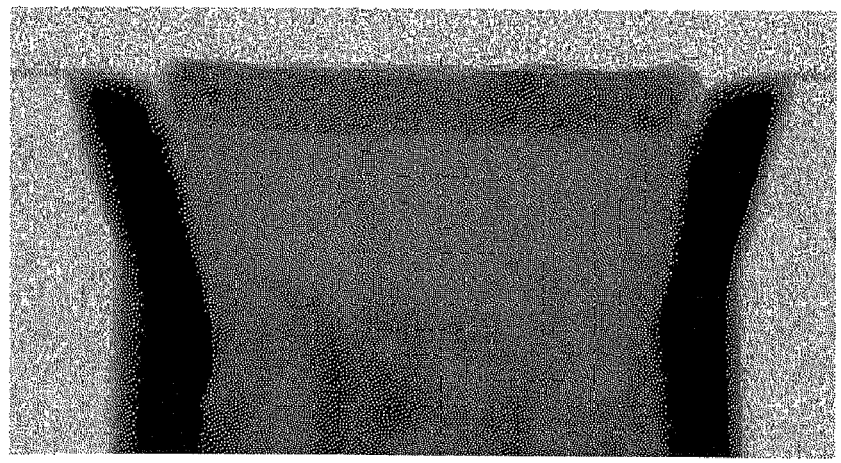
FIG. 6A and FIG. 6B are cross-sectional views of semiconductor devices, which were obtained in an example.
Figure 6B:
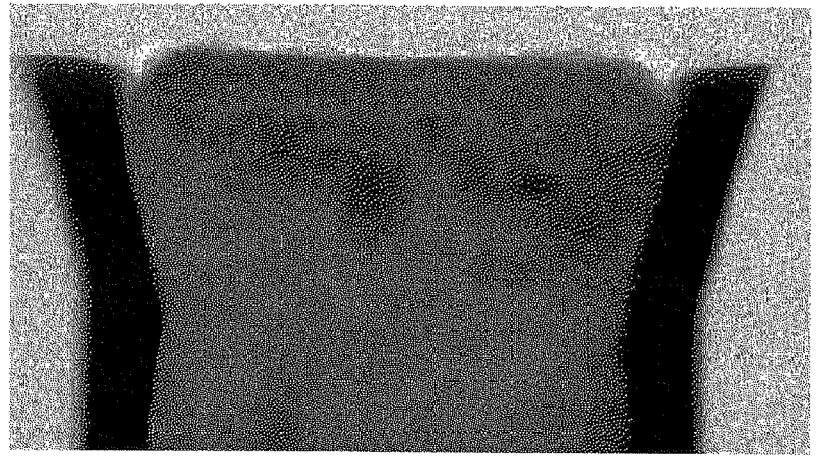

In the present example, a semiconductor device including via plugs and interconnects was manufactured, and interconnect resistances and reliabilities (via EM life) were evaluated. A COWP film was employed for the cap metal film, and was formed by an electroless plating process. FIG. 6A and FIG. 6B are cross-sectional views of semiconductor devices, which were obtained in the present example.

FIG. 6A shows a condition after the cap metal film is formed and before the protective film 115 is formed. FIG. 6B shows a condition of the device shown in FIG. 6A after a heat-treatment is conducted at a temperature of 380 degrees C. for 20 hours. While the gap was formed between the cap metal film and the barrier metal film in FIG. 6A, the gap disappears and the entire upper surface of the copper interconnect was covered with the protective film in FIG. 6B. No void is generated in the copper interconnect. Further, in vicinity of the side wall of the barrier metal film, Co concentration was higher in the protective film than the center of the copper interconnect.

Figure 7:
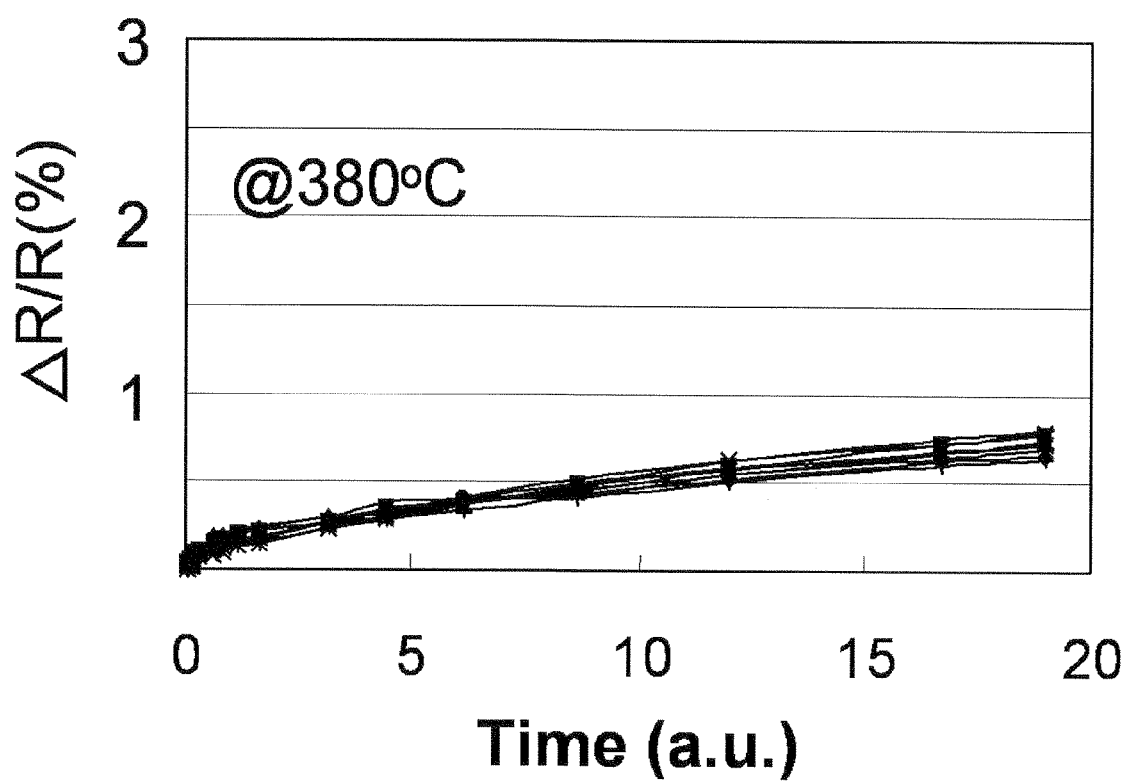
FIG. 7 is a graph, showing results of evaluations in the interconnect resistance of the semiconductor device in an example.

FIG. 7 is a graph, showing results of the evaluations in the interconnect resistance of the semiconductor device shown in FIG. 6B. FIG. 7 shows relationships between the storage time at 380 degrees C. and the rate of increase in the resistance. The resistance was continually increased by the storage at 380 degrees C., as can be seen in FIG. 7.

Figure 8:
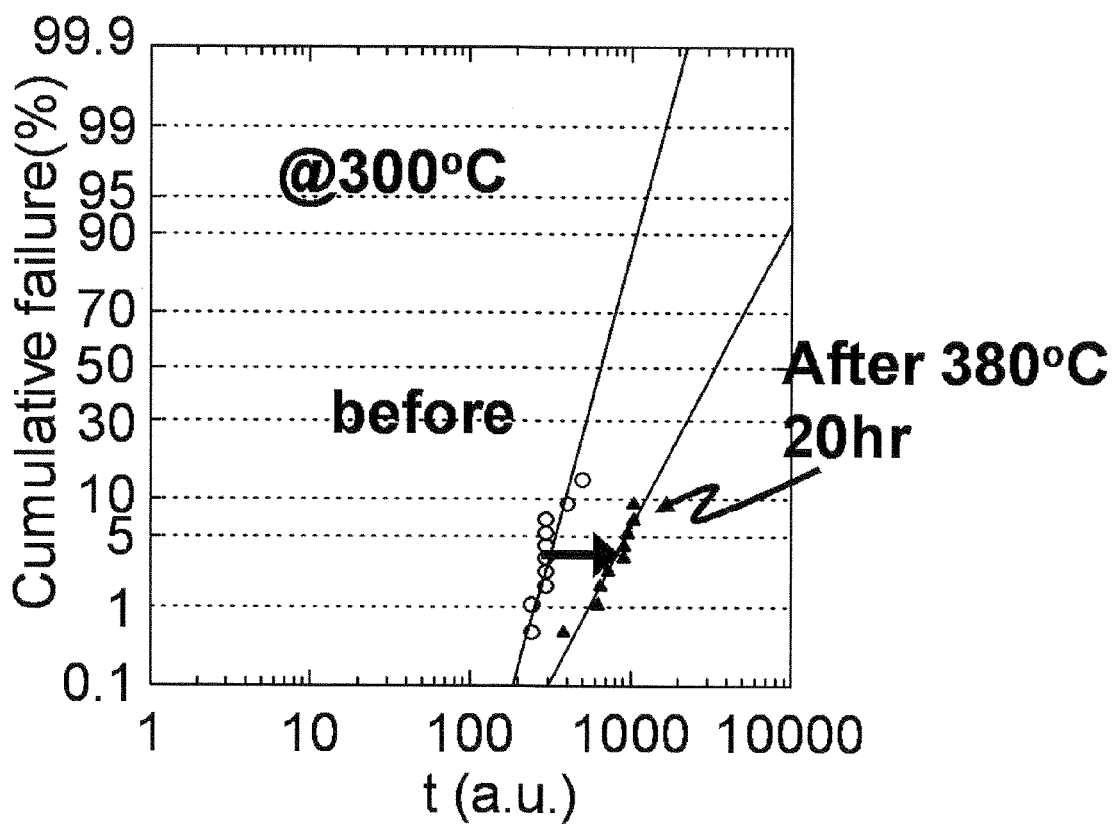
FIG. 8 is a graph, showing results of the evaluation in the EM life of the semiconductor device obtained in an example.

FIG. 8 is a graph, showing results of the evaluation in the EM life of the semiconductor device shown in FIG. 6B. In addition to above, the temperature for evaluating the EM life was selected as 300 degrees C. As can be seen from FIG. 8, the EM life was considerably improved by storing at 380 degree C. for 20 hours (black triangle (▲) in the graph).

Comparative Example

Figure 9A:
FIG. 9A to FIG. 9C are cross-sectional views of a semiconductor device obtained in an example.
Figure 9B:
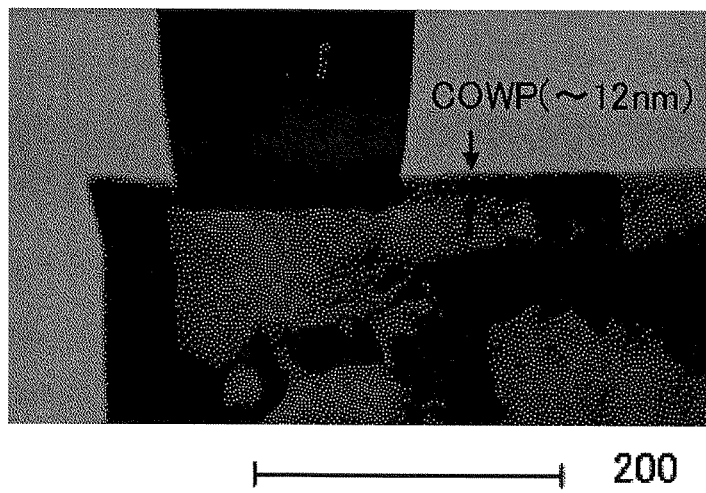
Figure 9C:
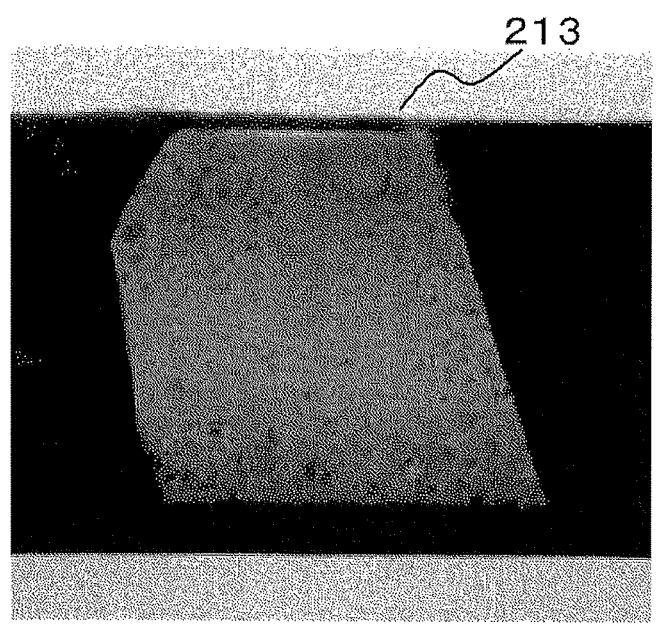

In this comparative example, a semiconductor device was manufactured without conducting a process for forming a protective film after the cap metal film was formed. FIG. 9A to FIG. 9C are cross-sectional views of semiconductor devices, which were obtained in the comparative example. In addition to above, FIG. 9B and FIG. 9C show enlarge portions of the device shown in FIG. 9A.

Figure 10A:
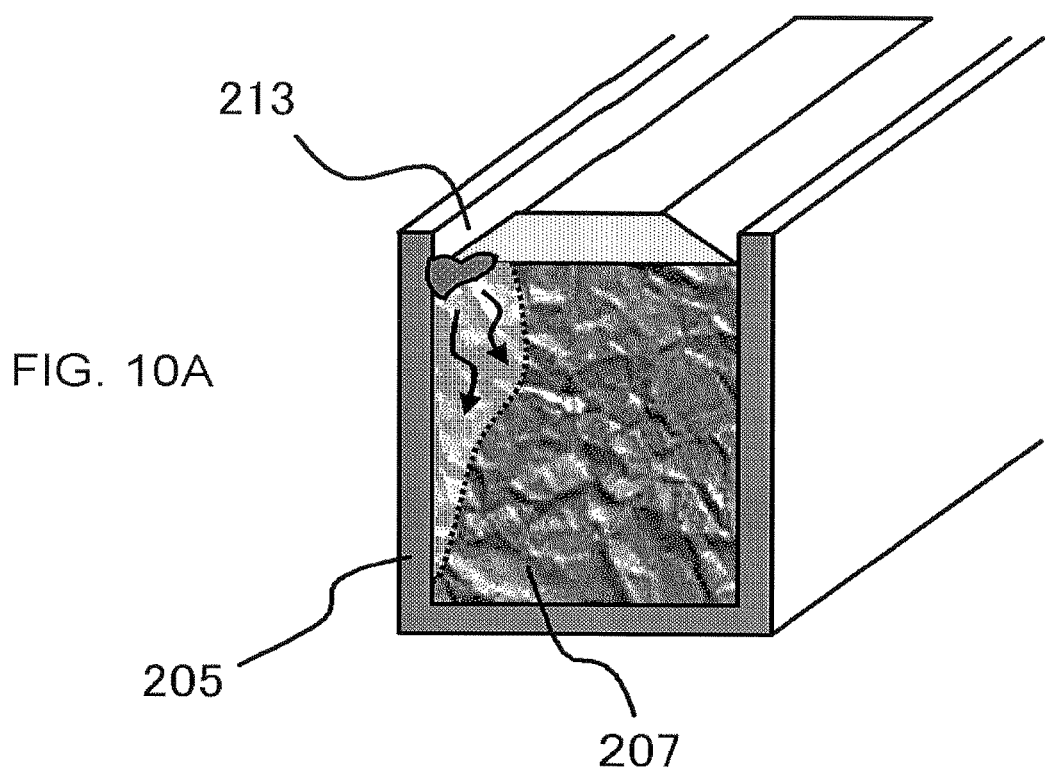
FIG. 10A and FIG. 10B are perspective views of the semiconductor device obtained in an example.
Figure 10B:
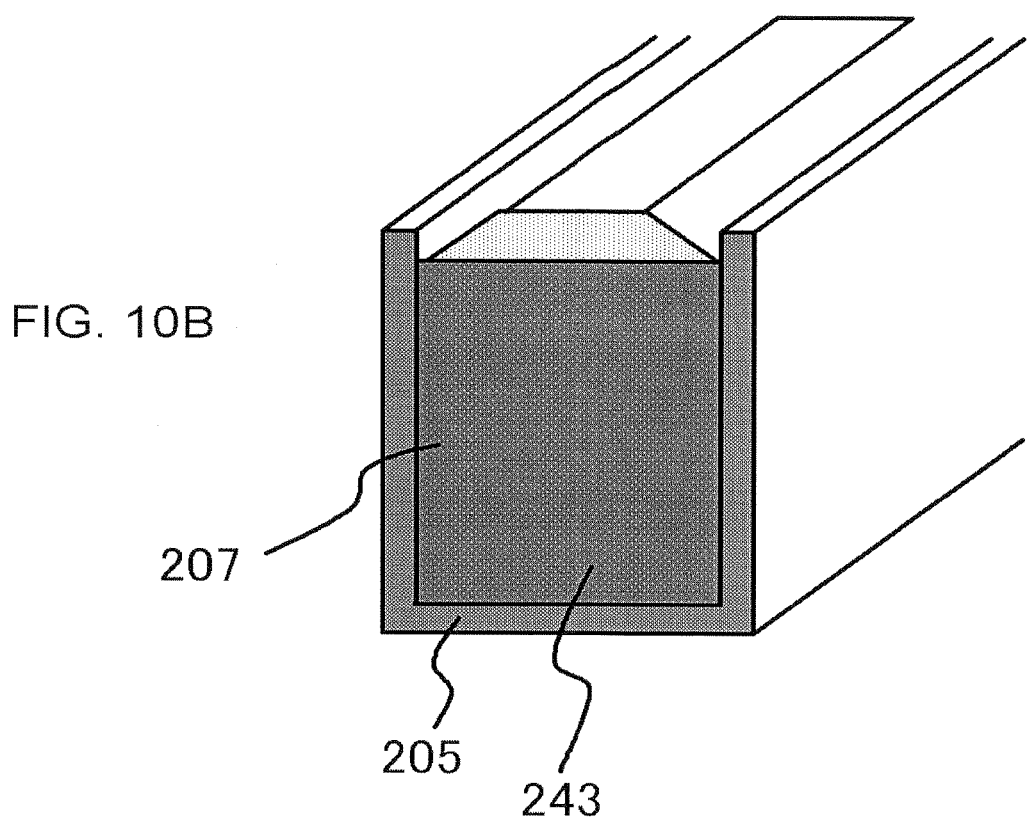

Further, FIG. 10A and FIG. 10B show perspective views of portions of the semiconductor device shown in FIG. 9A to FIG. 9C, which are schematically enlarged for further description.

Results of evaluations in the EM life of the obtained semiconductor device are shown in FIG. 8 by white circles (○) As shown in FIG. 9A to FIG. 9C and FIG. 10A and FIG. 10B, a gap 213 was remained between the cap metal film and the side wall of the barrier metal film 205 in the obtained semiconductor device. In addition to above, a diffusion of Cu in the copper interconnect 207 was progressed from the vicinity of the gap 213 to form a larger void 243 in the copper interconnect 207.

Since the process for manufacturing the semiconductor device in this comparative example involves the heating process at a highest reachable temperature of around 350 degrees C. for about 4 hours in total after the formation of the cap metal film, it was found that the heating process under such condition can not sufficient to form a protective film, which was otherwise obtained in the above-described example according to the present invention.

It is apparent that the present invention is not limited to the above embodiment, and may be modified and changed without departing from the scope and spirit of the invention.

What is claimed is:

1. A semiconductor device, comprising:
   an insulating film formed above a substrate and provided with a concave portion in a predetermined location;
   a barrier metal film covering inner side and bottom walls of said concave portion;
   a metal film composed of copper, provided so as to be in contact with said barrier metal film, and buried in an interior of said concave portion; and
   an electrically conducting film provided so as to be in contact with the top of said metal film composed of copper and also provided over substantially the entire top surface of said metal film composed of copper, said electrically conducting film containing cobalt (Co) or nickel (Ni) as constituent element,
   wherein an upper surface of said metal film composed of copper is provided so as to be closer to the substrate than an upper surface of said barrier metal film disposed over the inner side wall of said concave portion; and
   wherein Co concentration or Ni concentration in said electrically conducting film in vicinity of the inner side wall of said barrier metal film is higher than Co concentration or Ni concentration in said electrically conducting film in the central region of said concave portion.

2. The semiconductor device as set forth in claim 1, wherein said electrically conducting film is provided in the entire circumference along the inner side wall of said barrier metal film so as to be in contact with the inner side wall of said barrier metal film.

3. The semiconductor device as set forth in claim 1, wherein said upper surface of the barrier metal film covering the inner side walls is substantially coplanar with an uppermost surface of the insulating film.

4. The semiconductor device as set forth in claim 3, wherein said uppermost surface of said insulating film is disposed between an upper surface of said electrically conducting film and a lower surface of said electrically conducting film that contacts said metal film composed of copper.

5. The semiconductor device as set forth in claim 1, wherein a thickness of said metal film composed of copper is greater than a thickness of said barrier metal film.

6. The semiconductor device as set forth in claim 5, wherein a thickness of said metal film composed of copper is greater than a thickness of said electrically conducting film.

7. The semiconductor device as set forth in claim 1, wherein said electrically conducting film includes inclined sidewalls extending from a first position within the concave portion to a second position outside of the concave portion.

8. The semiconductor device as set forth in claim 7, wherein the second position of the inclined sidewalls adjoins at an uppermost surface of said electrically conducting film.

9. The semiconductor device as set forth in claim 1, wherein Co concentration or Ni concentration in said electrically conducting film in the central region of said concave portion is substantially uniform.

10. The semiconductor device as set forth in claim 1, further comprising a through hole formed in an insulating interlayer formed on the insulating film, the electrically conducting film, and the upper surface of said barrier metal film, and into an upper surface of said electrically conducting film.

11. The semiconductor device as set forth in claim 10, further comprising another barrier metal film formed on inner side and bottom walls of the through hole.

12. The semiconductor device as set forth in claim 11, further comprising another metal film composed of copper, provided so as to be in contact with said another barrier metal film, and buried in an interior of said through hole.

13. The semiconductor device as set forth in claim 12, wherein said another barrier metal film and said another metal film both extend into said electrically conducting film.

* * * * *